(12) United States Patent
Lee et al.

(10) Patent No.: US 7,867,835 B2
(45) Date of Patent: Jan. 11, 2011

(54) INTEGRATED CIRCUIT SYSTEM FOR SUPPRESSING SHORT CHANNEL EFFECTS

(75) Inventors: Jae Gon Lee, Singapore (SG); Elgin Kiok Boone Quek, Singapore (SG); Young Way Teh, Singapore (SG); Wenzhi Gao, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 331 days.

(21) Appl. No.: 12/040,777

(22) Filed: Feb. 29, 2008

(65) Prior Publication Data

US 2009/0218636 A1    Sep. 3, 2009

(51) Int. Cl.
*H01L 27/088* (2006.01)
(52) U.S. Cl. ...................... 438/197; 257/394
(58) Field of Classification Search .................. 310/303; 257/394; 438/197; *H01L 27/088*
See application file for complete search history.

(56) References Cited

U.S. PATENT DOCUMENTS

| | | | |
|---|---|---|---|
| 5,899,719 A | 5/1999 | Hong | |
| 6,228,730 B1 * | 5/2001 | Chen et al. | 438/301 |
| 6,300,205 B1 | 10/2001 | Fulford et al. | |
| 6,555,437 B1 | 4/2003 | Yu | |
| 6,746,926 B1 | 6/2004 | Yu | |
| 7,456,062 B1 * | 11/2008 | En et al. | 438/231 |
| 7,652,336 B2 * | 1/2010 | Han et al. | 257/384 |
| 2002/0053688 A1 * | 5/2002 | Gonzalez et al. | 257/288 |
| 2004/0094782 A1 * | 5/2004 | Chen et al. | 257/288 |
| 2005/0026380 A1 * | 2/2005 | Kammler et al. | 438/305 |
| 2005/0133835 A1 * | 6/2005 | Bu et al. | 257/288 |
| 2006/0273391 A1 * | 12/2006 | Diaz et al. | 257/335 |
| 2007/0026595 A1 * | 2/2007 | Fukutome et al. | 438/197 |
| 2007/0128786 A1 * | 6/2007 | Cheng et al. | 438/199 |
| 2009/0032888 A1 * | 2/2009 | En et al. | 257/408 |
| 2009/0078997 A1 * | 3/2009 | Greene et al. | 257/347 |
| 2009/0236669 A1 * | 9/2009 | Chen et al. | 257/380 |
| 2010/0065922 A1 * | 3/2010 | Han et al. | 257/384 |

* cited by examiner

*Primary Examiner*—Quyen Leung
*Assistant Examiner*—Terrance Kenerly
(74) *Attorney, Agent, or Firm*—Mikio Ishimaru (57) ABSTRACT

An integrated circuit system that includes: providing a substrate including an active device with a gate and a gate dielectric; forming a first liner, a first spacer, a second liner, and a second spacer adjacent the gate; forming a material layer over the integrated circuit system; forming an opening between the material layer and the first spacer by removing a portion of the material layer, the second spacer, and the second liner to expose the substrate; and forming a source/drain extension and a halo region through the opening.

20 Claims, 3 Drawing Sheets

FIG. 9

INTEGRATED CIRCUIT SYSTEM FOR SUPPRESSING SHORT CHANNEL EFFECTS

TECHNICAL FIELD

The present invention relates generally to integrated circuits, and more particularly to an integrated circuit system for suppressing short channel effects.

BACKGROUND ART

Integrated circuits find application in many of today's consumer electronics, such as cell phones, video cameras, portable music players, printers, computers, etc. Integrated circuits may include a combination of active devices, passive devices and their interconnections.

Active devices are typically comprised by metal-oxide-semiconductor field-effect transistor (MOSFET) devices, which generally include a semiconductor substrate, having a source, a drain, and a channel located between the source and drain. A gate stack composed of a conductive material (i.e., a gate) and an oxide layer (i.e., a gate oxide) are typically located directly above the channel. During operation, an inversion layer forms a conducting bridge or "channel" between the source and drain when a voltage is applied to the gate. Both p-channel and n-channel MOSFET technologies are available and can be combined on a single substrate in one technology, called complementary-metal-oxide-semiconductor or CMOS.

Scaling of the MOSFET, whether by itself or in a CMOS configuration, has become a major challenge for the semiconductor industry. Size reduction of the integral parts of a MOSFET has lead to improvements in device operation speed and packing density, but size reduction has its limits. For example, as scaling of the MOSFET reaches the submicron era, short channel effects have become a major design problem due to the reduction in size of the gate length. Unfortunately, design solutions for ameliorating the short channel effect, such as the halo implant, commonly form the tail of the halo implant outside of the source and drain junction, thereby increasing junction capacitance and junction leakage.

Thus, a need still remains for a reliable integrated circuit system and method of fabrication, wherein the integrated circuit system includes a highly-doped and abrupt source/drain extension and a highly confined/abrupt halo region designed to suppress short channel effects. In view of the ever-increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit system including: providing a substrate including an active device with a gate and a gate dielectric; forming a first liner, a first spacer, a second liner, and a second spacer adjacent the gate; forming a material layer over the integrated circuit system; forming an opening between the material layer and the first spacer by removing a portion of the material layer, the second spacer, and the second liner to expose the substrate; and forming a source/drain extension and a halo region through the opening.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown exaggerated in the drawing FIGS. Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

The term "on" is used herein to mean there is direct contact among elements.

The terms "example" or "exemplary" are used herein to mean serving as an instance or illustration. Any aspect or embodiment described herein as an "example" or as "exemplary" is not necessarily to be construed as preferred or advantageous over other aspects or designs.

The terms "first", "second", and "third" as used herein are for purposes of differentiation between elements only and are not to be construed as limiting the scope of the present invention.

The term "system" as used herein means and refers to the method and to the apparatus of the present invention in accordance with the context in which the term is used.

Generally, the following embodiments relate to the formation of an integrated circuit system including, but not limited to, an active device structure with a strategically engineered source/drain extension and halo region that reduces junction capacitance and junction leakage while suppressing the adverse short channel effects common to nano-scaled devices (i.e., devices employing a critical dimension of 45 nanometers and less).

FIGS. 1-8, which follow, depict by way of example and not by limitation, an exemplary process flow for the formation of an integrated circuit system and they are not to be construed as limiting. It is to be understood that a plurality of conventional processes that are well known within the art and not repeated herein, may precede or follow FIGS. 1-8. Moreover, it is to be understood that many modifications, additions, and/or omissions may be made to the below described process without departing from the scope or spirit of the claimed subject matter. For example, the below described process may include more, fewer, or other steps. Additionally, steps may be performed in any suitable order without departing from the scope of the present invention.

Moreover, it is to be appreciated that the integrated circuit system of the present disclosure may include any number of multi-electrode devices (e.g., active device structures) in which the current flowing between two specified electrodes is controlled or modulated by the voltage applied at a control electrode. Exemplary illustrations may include an n-channel field effect transistor (NFET), a p-channel field effect transistor (PFET), a complementary metal-oxide-silicon (CMOS) configuration, a single-gate transistor, a multi-gate transistor, a fin-FET, or an annular gate transistor. Furthermore, it is to be understood that one or more of the integrated circuit system could be prepared at one time on a medium, which could be separated into individual or multiple integrated circuit assemblies at a later stage of fabrication.

Figure 1:
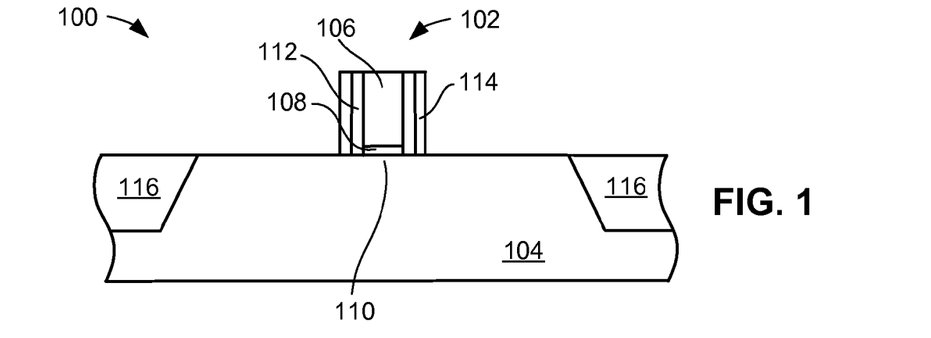
FIG. 1 is a partial cross sectional view of an integrated circuit system in an initial stage of manufacture in accordance with an embodiment of the present invention.

Referring now to FIG. 1, therein is shown a partial cross sectional view of an integrated circuit system 100 in an initial stage of manufacture in accordance with an embodiment of the present invention. In some embodiments, the integrated circuit system 100 may include an active device 102. In such cases, the active device 102 may more particularly include NFET devices, PFET devices and/or a combination thereof (i.e., CMOS devices), for example. However, it is to be understood that the active device 102 is not limited to the preceding examples and may include any number of multi-electrode devices in which the current flowing between two specified electrodes is controlled or modulated by the voltage applied at a control electrode. Accordingly, although the embodiments described herein are presented for forming doped regions adjacent to a single gate structure, the methods may be used to form doped regions adjacent to any number of gate structures.

Moreover, it is to be understood that the integrated circuit system 100 manufactured by the embodiments described herein can be used within processor components, memory components, logic components, digital components, analog components, mixed-signal components, power components, radio-frequency (RF) components (e.g., RF CMOS circuits), digital signal processor components, micro-electromechanical components, optical sensor components, and so forth, in numerous configurations and arrangements as may be needed.

In some embodiments, the active device 102 can be formed over, on and/or within a substrate 104 by conventional deposition, patterning, photolithography, and etching techniques known in the semiconductor processing industry for the manufacture of active devices. By way of example, the substrate 104 may include any semiconducting material, such as, Si, SiC, SiGe, Si/SiGe, SiGeC, Ge, GaAs, InAs, InP, other III/V or II/VI compound semiconductors, as well as silicon-on-insulator configurations. Additionally, the substrate 104 may also include doped and undoped configurations, epitaxial layers, strained configurations, and one or more crystal orientations (e.g., <100>, <110>, and/or <111> orientations), which may be strategically employed to optimize carrier mobility within NFET and/or PFET devices.

In some embodiments, the substrate 104 may possess a thickness ranging from about one hundred (100) nanometers to about several hundred microns, for example.

However, the examples provided for the substrate 104 are not to be construed as limiting and the composition of the substrate 104 may include any material, configuration, or thickness that physically and electrically enables the formation of active and/or passive device structures.

In general, the active device 102 includes a gate 106, a gate dielectric 108, a channel 110, a first liner 112, and a first spacer 114.

In some embodiments, the gate 106 may be formed from conventional materials including doped and undoped semiconducting materials (such as, for example, polySi, amorphous Si, or SiGe), a metal, a metallic alloy, a silicide, or a combination thereof, for example. The gate dielectric 108 may be made from materials including, but not limited to, silicon oxide, silicon oxynitride, silicon nitride, a silicon oxide/nitride/oxide stack, a high-k dielectric material (i.e., one having a dielectric constant value greater than silicon oxide), or a combination thereof. However, it is to be understood that the type of material chosen for the gate dielectric 108 is not limited to the above examples; for example, the gate dielectric 108 may include any material that permits induction of a charge in the channel 110 when an appropriate voltage is applied to the gate 106. Accordingly, other materials, which may be known to those skilled in the art for gate structures, may also be used for the gate 106 and the gate dielectric 108.

Generally, the thickness of the gate 106 is between about 300 angstroms and about 3000 angstroms and the thickness of the gate dielectric 108 is between about 15 angstroms and about 50 angstroms. However, larger or smaller thicknesses of the gate 106 and the gate dielectric 108 may be appropriate depending on the design specifications of the active device 102.

The first liner 112 can be made from dielectric materials such as an oxide, a nitride, or a combination thereof, but preferably includes silicon dioxide. The first liner 112 can be formed by a variety of techniques, including, but not limited to, chemical vapor deposition, physical vapor deposition and thermal oxidation.

In some embodiments, the first liner 112 can be formed by oxidation of the gate 106 material, followed by removal of the oxide from over the substrate 104, thereby forming the first liner 112. However, it is to be understood that the type of materials and method chosen for the formation of the first liner 112 is not limited to the above examples and may include any material and method that permits the formation of a gate sidewall structure that electrically isolates the gate 106.

Generally, the first liner 112 may include a thickness ranging from about 20 angstroms to about 50 angstroms for a growth process and about 50 angstroms to about 150 angstroms for a deposition process. However, it is to be understood that the thickness of the first liner 112 may vary with the design specifications of the active device 102. For example, the thickness of the first liner 112 may vary with the desired placement of a halo region 602 and/or a source/drain extension 600, both of FIG. 6.

The first spacer 114 may also be formed from conventional dielectric materials such as an oxide, a nitride, or a combination thereof, but preferably includes silicon nitride. In general, the first spacer 114 is typically formed of a material that can be selectively etched with respect to the material of the first liner 112. The first spacer 114 can be formed by a variety of techniques, including, but not limited to, chemical vapor deposition and physical vapor deposition.

In some embodiments, the first spacer 114 can be formed by deposition of a nitride layer over the gate 106, the first liner 112, and adjacent portions of the substrate 104, followed by an anisotropic etch to form the first spacer 114 adjacent the first liner 112 and the gate 106. However, it is to be understood that the type of materials and method chosen for the formation of the first spacer 114 is not limited to the above examples and may include any material and method that permits the formation of a gate sidewall structure that exhibits a high etch selectivity with respect to a second liner 200, of FIG. 2.

Generally, the first spacer 114 may include a thickness ranging from about 50 angstroms to about 150 angstroms. However, it is to be understood that the thickness of the first spacer 114 may vary with the design specifications of the active device 102. For example, the thickness of the first spacer 114 may vary with the desired placement of the halo region 602 and/or the source/drain extension 600.

In some embodiments, an isolation structure 116, such as a shallow trench isolation structure, can electrically isolate and/or separate the active device 102 from other structures. For purposes of illustration, the isolation structure 116 may be made from a dielectric material such as silicon dioxide ("$SiO_2$").

Figure 2:
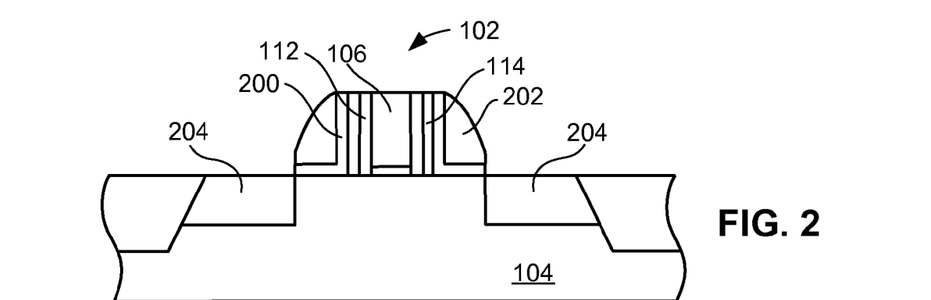
FIG. 2 is the structure of FIG. 1 after further processing.

Referring now to FIG. 2, therein is shown the structure of FIG. 1 after further processing. In some embodiments, the second liner 200 and a second spacer 202 can be formed adjacent the gate 106 and may act as dummy sidewall spacers that will be removed by a subsequent etch step that exposes a portion of the substrate 104 for further processing. Accordingly, it is to be understood that the thickness of each of the second liner 200 and the second spacer 202 depends upon the desired size of the exposed portion of the substrate 104.

In general, the second liner 200 is typically formed of a material that can be selectively etched with respect to the material of the first spacer 114. By way of example, the second liner 200 can be formed from a dielectric material, such as an oxide, a nitride, or a combination thereof, but preferably includes silicon dioxide. The second liner 200 can be formed by a variety of techniques, including, but not limited to, chemical vapor deposition, physical vapor deposition and thermal oxidation.

In some embodiments, the second liner 200 may include a low temperature oxide film (e.g., an oxide deposited by reacting silane with either oxygen, nitrous oxide, or carbon dioxide at temperatures below about 800° C. in a plasma) conformally deposited over the gate 106, the first liner 112, the first spacer 114, and adjacent portions of the substrate 104. However, it is to be understood that the type of materials and deposition method chosen for the second liner 200 is not limited to the above examples and may include any material and deposition method that permits selective removal of the second liner 200 and exposure of the substrate 104 during a subsequent processing step. Moreover, it is to be understood that the etch step which forms the second liner 200 can be performed either prior to or subsequent to the formation of the second spacer 202.

In some embodiments, the second liner 200 may include a thickness ranging from about 50 angstroms to about 200 angstroms. However, it is to be understood that the thickness of the second liner 200 may vary with the design specifications of the active device 102. For example, the thickness of the second liner 200 may depend upon its ability to act as an etch stop layer during the removal of the second spacer 202, the desired size of the area exposed on the substrate 104 and/or the desired placement of the halo region 602 and/or the source/drain extension 600, both of FIG. 6.

Subsequent to depositing the dielectric material that forms the second liner 200, the second spacer 202 may be formed by depositing and etching a dielectric material such as an oxide, a nitride, or a combination thereof, to form the second spacer 202. In general, the second spacer 202 is typically formed of a material that can be selectively etched with respect to the material of the second liner 200. The second spacer 202 can be formed by a variety of techniques, including, but not limited to, chemical vapor deposition and physical vapor deposition.

In some embodiments, the second spacer 202 may include a nitride layer deposited over the second liner 200 by a low pressure chemical vapor deposition (LPCVD) or plasma enhanced chemical vapor deposition (PECVD) technique. In other embodiments, the second spacer 202 may more preferably include a nitride layer deposited over the second liner 200 via a rapid thermal chemical vapor deposition (RTCVD) method. However, it is to be understood that the type of material and deposition method chosen for the second spacer 202 is not limited to the above examples and may include any material and deposition method that permits selective removal of the second spacer 202 with respect to the second liner 200 and exposure of the second liner 200 during a subsequent processing step.

In some embodiments, the second spacer 202 may include a thickness ranging from about 200 angstroms to about 500 angstroms at its interface with the second liner 200. However, it is to be understood that the thickness of the second spacer 202 may vary with the design specifications of the active device 102. For example, the thickness of the second spacer 202 may depend upon the desired size of the area exposed on the substrate 104, the desired placement of a source/drain 204, and/or the desired placement of the halo region 602 and/or the source/drain extension 600.

As noted above, the etch step which forms the second liner 200 can be performed either prior to or subsequent to the formation of the second spacer 202. In such cases, the etch process that forms the second liner 200 and the second spacer 202 may include a single step etch process or a multiple step etch process.

Subsequent to forming the second liner 200 and the second spacer 202, the source/drain 204 can be formed within the substrate 104. In some embodiments the source/drain 204 can be aligned to the second spacer 202. In general, the source/drain 204 may be formed with an implantation energy between about 1 keV and about 70 keV and a dose between about $1 \times 10^{14}$ ions/cm$^2$ to about $1 \times 10^{15}$ ions/cm$^2$. However, larger or smaller energies and doses may be used depending upon the impurity used and the design specifications of the active device 102. It is to be understood that the impurities used to form the source/drain 204 may be n-type or p-type, depending on the device being formed (e.g., n-type impurities for an NMOS device and p-type impurities for a PMOS device).

Subsequent to forming the source/drain 204, an anneal step can be performed to electrically activate the dopants within the active device 102 (e.g., the source/drain 204). It is to be understood that the anneal step may include any thermal process that electrically activates the dopants within the active device 102, such as a rapid thermal anneal, a spike anneal and/or a laser anneal.

Additionally, it is to be understood that the combined thicknesses of the first liner 112, the first spacer 114, the second liner 200, and the second spacer 202 may determine, at least in part, the location of the halo region 602 and/or the source/drain extension 600.

Figure 3:
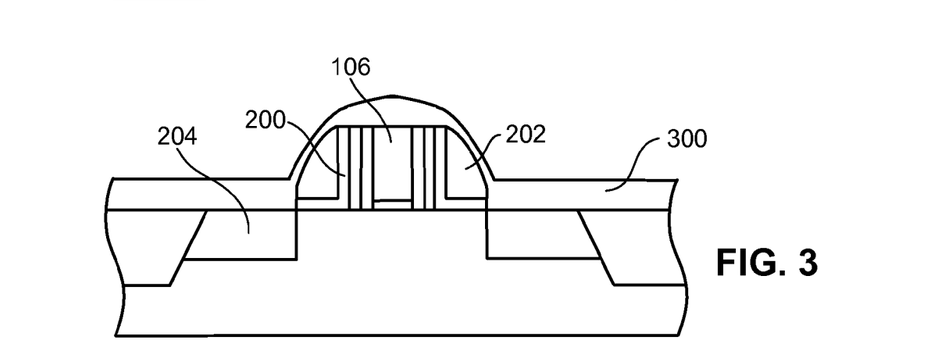
FIG. 3 is the structure of FIG. 2 after depositing a material layer.

Referring now to FIG. 3, therein is shown the structure of FIG. 2 after depositing a material layer 300. In some embodiments, the material layer 300 may include any nonconformal oxide. In other embodiments, the material layer 300 may include a sacrificial high density plasma deposited oxide. In yet other embodiments, the material layer 300 may include any type of grown or deposited oxide layer that protects the substrate 104 and/or the gate 106 during subsequent processing steps.

By way of example, portions of the material layer 300 formed over the source/drain 204 and the gate 106 may range in thickness from about 300 angstroms to about 500 angstroms and portions of the material layer 300 formed over the second liner 200 and the second spacer 202 may range in thickness from about 100 angstroms to about 200 angstroms.

However, it is to be understood that the above described materials, methods, and thicknesses used to form the material layer 300 are not essential, what is important is that the material layer 300 permits selective exposure of the second spacer 202 upon etching, without exposing the gate 106 and the source/drain 204.

Figure 4:
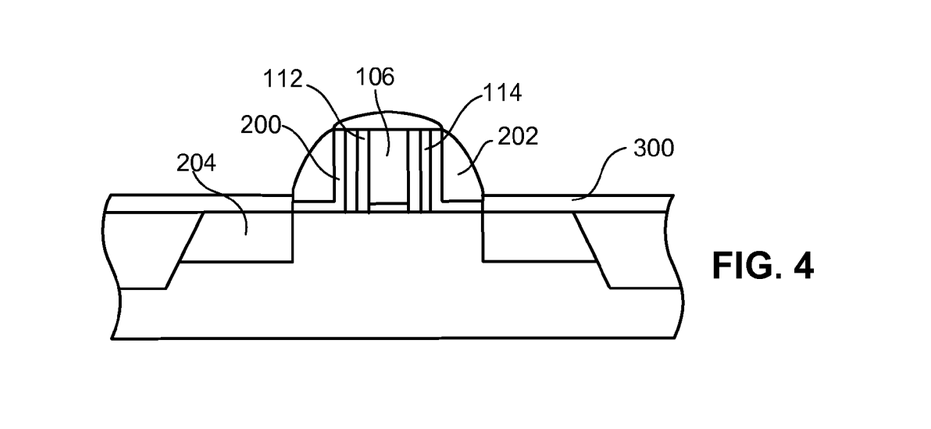
FIG. 4 is the structure of FIG. 3 after etching a material layer.

Referring now to FIG. 4, therein is shown the structure of FIG. 3 after etching the material layer 300. In some embodiments, the material layer 300 can be removed from over the second spacer 202 by employing etch methods selective to the composition of the material layer 300. For example, the material layer 300 can be etched by common wet or dry etch chemistries. However, it is to be understood that the type of etch chemistry used to etch the material layer 300 is not essential, what is important is that the material layer 300 is removed from over the second spacer 202 after etching.

Notably, after etching, the material layer 300 remains intact over the source/drain 204, the second liner 200, the first spacer 114, the first liner 112, and the gate 106, thereby helping to protect these structures from damage that may occur during the removal of the second spacer 202 and the second liner 200 and subsequent implantation steps.

Figure 5:
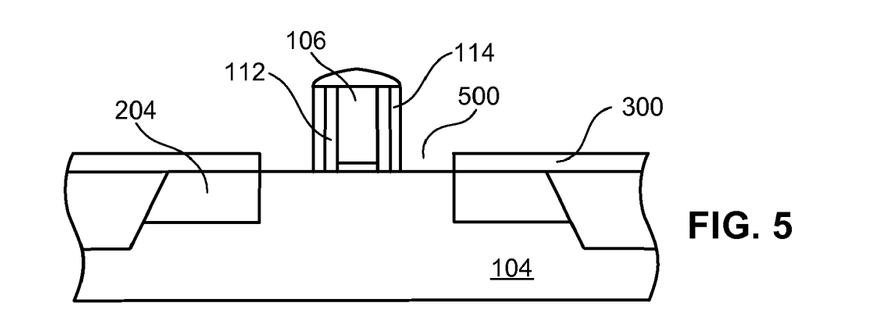
FIG. 5 is the structure of FIG. 4 after further processing.

Referring now to FIG. 5, therein is shown the structure of FIG. 4 after further processing. In general, the second spacer 202 and the second liner 200, both of FIG. 4, can be removed from over the substrate 104, thereby forming an opening 500 between the first spacer 114 and the material layer 300 on either side of the gate 106. In some embodiments, the etch process that removes the second spacer 202 and the second liner 200 can be performed by a variety of etching techniques, including, but not limited to, a single step etch process or a multiple step etch process. In other embodiments, the second spacer 202 can be removed by a hot phosphoric acid etch and the second liner 200 can be removed by conventional wet or dry etch chemistries that are highly selective to the composition of the second liner 200.

However, it is to be understood that the type of etch process selected to remove the second spacer 202 and the second liner 200 is not critical, what is important is that the selected etch process removes the second spacer 202 and the second liner 200, thereby exposing the substrate 104 to a strategically engineered source and drain extension implant and halo implant. It is to be understood that the size of the area exposed on the substrate 104 can be controlled by varying the thickness dimensions of the second spacer 202 and the second liner 200.

In some embodiments, the exposed portion of the substrate 104 may undergo a cleaning step to remove surface contaminants, such as particles, mobile ionic contaminants, organics and native oxides, before further processing.

Notably, after removing the second spacer 202 and the second liner 200, the material layer 300 remains intact over the source/drain 204, the first spacer 114, the first liner 112, and the gate 106.

Figure 6:
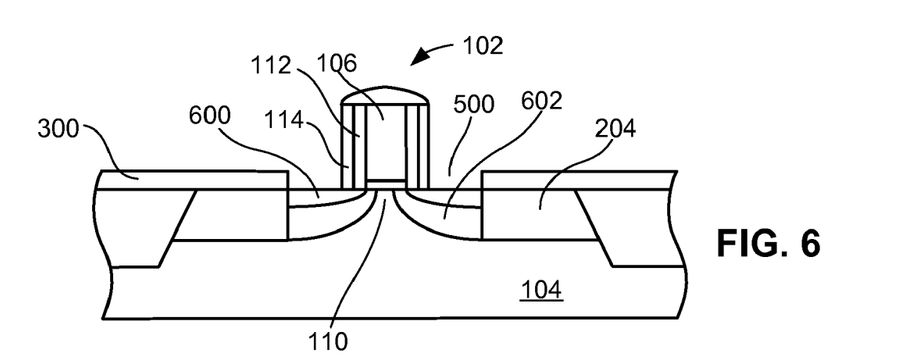
FIG. 6 is the structure of FIG. 5 after formation of a source/drain extension and/or a halo region.

Referring now to FIG. 6, therein is shown the structure of FIG. 5 after formation of the source/drain extension 600 and/or the halo region 602. In general, the source/drain extension 600 may be formed to a shallow depth with a low concentration of impurities relative to the source/drain 204. More specifically, the source/drain extension 600 can be formed from a dopant implant dose between about $1 \times 10^{14}$ ions/cm$^2$ to about $1 \times 10^{15}$ ions/cm$^2$. However, larger or smaller doses may be used depending upon the impurity used and the design specifications of the active device 102. Moreover, it is to be understood that the above parameters are not limiting and those skilled in the art will appreciate that additional parameters may also be employed/manipulated to effectuate the purpose of implanting a highly-doped and abrupt form of the source/drain extension 600.

The impurities used to form the source/drain extension 600 may include n-type or p-type, depending on the active device 102 being formed (e.g., n-type impurities for an NMOS device and p-type impurities for a PMOS device). Typically, the impurities used to form the source/drain extension 600 are of the same conductivity type as the impurities used to form the source/drain 204. It is to be understood that the source/drain extension 600 can be formed via an angled or perpendicular, with respect to the surface of the substrate 104, implant.

As is known in the art, a halo implant can help to decrease the length of the channel 110, which may be advantageous for minimizing punchthrough current and short channel effects, thereby improving the performance of the active device 102. In general, the halo region 602 can be formed by implanting impurities through the opening 500 adjacent the gate 106. In some embodiments, the halo region 602 can be formed by implanting the substrate 104 with impurities of opposite conductivity type to that of the impurities used to form the source/drain 204 and the source/drain extension 600. For example, if the source/drain 204 and the source/drain extension 600 are formed with n-type impurities then the halo region 602 can be formed with p-type impurities. In at least one embodiment, the halo region 602 can be formed partially outside the boundaries of the source/drain extension 600.

The halo dopant material is typically implanted at an angle so that the dopant material can be implanted underneath the first spacer 114, the first liner 112 and the gate 106. In general, the angle of the implantation is typically substantially less than ninety degrees relative to the surface of the substrate 104, e.g., between about fifteen to about seventy-five degrees relative to the surface of the substrate 104. In some embodiments, the substrate 104 can be rotated (e.g., dual and quad halo implants) during the angled halo implantation to provide symmetrical forms of the halo region 602. However, in other embodiments, the halo dopant implant may be implanted perpendicular to the surface of the substrate 104.

In either case, the halo implants may be implanted at an energy between approximately 5 keV and approximately 100 keV and a dose between about $1 \times 10^{12}$ ions/cm$^2$ and about $1 \times 10^{14}$ ions/cm$^2$ to form the halo region 602. However, it is to be understood that larger or smaller energies and doses may be used and fabricated depending on the impurity implanted and the design specifications of the active device 102. Moreover, it is to be understood that the above parameters are not limiting and those skilled in the art will appreciate that additional parameters may also be employed/manipulated to effectuate the purpose of implanting a highly confined form of the halo region 602.

Subsequent to forming the source/drain extension 600 and the halo region 602, an anneal can be performed to activate the dopants within the source/drain extension 600 and the halo region 602. The present inventors have discovered that by optimizing the anneal of the source/drain extension 600 and the halo region 602 that a highly-doped and abrupt form of the source/drain extension 600, as well as, a highly confined/abrupt form of the halo region 602 can be formed. For example, the methods of the present embodiments enables the formation of the source/drain extension 600 and the halo region 602 with an abruptness that exhibits an order of magnitude of change in the atomic concentration of dopants in several nanometers or less, thereby helping to suppress adverse short channel effects common to sub-45 nm technology node devices. It is to be understood that the anneal step may include any thermal process, but preferably includes a spike anneal or a millisecond anneal.

By way of example, in some embodiments, the thermal process may include a spike anneal performed at a temperature range between about 1000° C. and about 1100° C. In other embodiments, the thermal process may include a millisecond anneal, such as a flash lamp anneal or a laser spike anneal, performed at a temperature range between about 1200° C. and about 1300° C. In such cases, the millisecond anneal can be optimized to be a diffusionless process, thereby enhancing the highly confined nature of the halo profile for the halo region 602.

Notably, the present inventors have discovered that the halo region 602 fabricated by the methods of the disclosed embodiments reduces the need for a graded form of the source/drain 204 (i.e., a lower graded source/drain 204 implant is possible). It is to be understood that graded implants are typically employed to reduce junction capacitance. Accordingly, as the present embodiments already reduce junction capacitance, the need for a graded form of the source/drain 204 can be reduced. Not wishing to be limited to any particular theory, the present inventors believe that the formation of the halo region 602 by the present embodiments reduces the need for a graded form of the source/drain 204, thereby helping to suppress short channel effects due to diffusion of dopants from the source/drain 204 into the source/drain extension 600 and/or into the channel 110. As such, junction capacitance degradation can be minimized because the present embodiments eliminate the formation of a halo tail region adjacent the source/drain 204, thereby improving device performance.

Moreover, the present inventors have also discovered that by implanting the halo region 602 through the opening 500 that the tail of the halo implant is formed within the source/drain 204, thereby resulting in a lower junction capacitance and lower junction leakage. Not wishing to be limited to any particular theory, the present inventors believe that the formation of the material layer 300 over the source/drain 204 protects the source/drain 204 from the halo implant, thereby preventing the formation of the halo implant tail region adjacent the source/drain 204 within the substrate 104.

It is to be understood that the order in which the source/drain extension 600 and the halo region 602 are formed in not critical, what is important is that the process parameters (e.g., dose and energy) used to form the source/drain extension 600 and the halo region 602 be regulated to produce the desired conductivity type and electrical characteristics within each of the source/drain extension 600 and the halo region 602. For example, the source/drain extension 600 and the halo region 602 may each be formed at a sufficient dose such that the majority concentration of impurities in each is of opposite conductivity type.

As noted above, the opening 500 can be formed by the removal of the second liner 200 and the second spacer 202, both of FIG. 4, thereby exposing a portion of the substrate 104 adjacent the gate 106. The present inventors have discovered that by strategically controlling the thickness of each of the first liner 112, the first spacer 114, the second liner 200, and the second spacer 202 that highly-doped and abrupt forms of the source/drain extension 600 and highly confined/abrupt forms of the halo region 602 can be formed.

Figure 7:
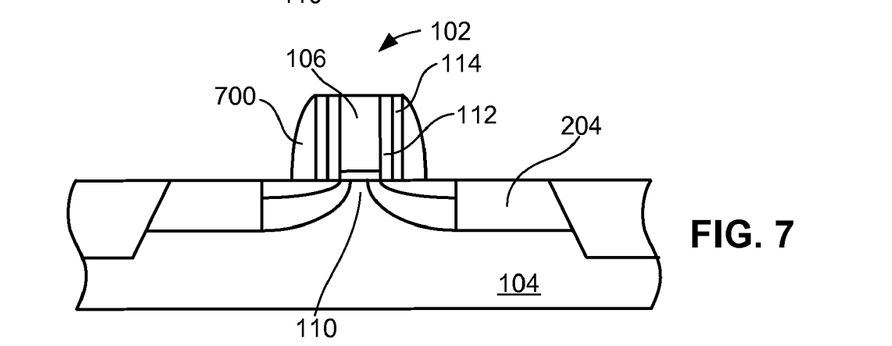
FIG. 7 is the structure of FIG. 6 after formation of a third spacer.

Referring now to FIG. 7, therein is shown the structure of FIG. 6 after formation of a third spacer 700. The material layer 300, of FIG. 6, can be removed from over the source/drain 204, the first spacer 114, the first liner 112, and the gate 106. In general, the etch process that removes the material layer 300 can be performed by a variety of etching techniques, including, but not limited to, a single step etch process or a multiple step etch process. In some embodiments, the material layer 300 can be removed by conventional wet or dry etch chemistries that are highly selective to the composition of the material layer 300. However, it is to be understood that the type of etch process selected to remove the material layer 300 is not critical, what is important is that the selected etch process removes the remaining portions of the material layer 300, thereby exposing the substrate 104 to a subsequent low resistance contact formation process.

Subsequent to removing the material layer 300, the third spacer 700 can be formed by depositing and etching a dielectric material such as an oxide, a nitride, or a combination thereof. In general, the third spacer 700 is typically formed of a material that can block the subsequent deposition of an electrical contact 800, of FIG. 8.

The third spacer 700 can be formed by a variety of techniques, including, but not limited to, chemical vapor deposition and physical vapor deposition. In some embodiments, the third spacer 700 may include a nitride layer deposited by PECVD methods. In other embodiments, the third spacer 700 may include a nitride layer deposited by PECVD methods at a temperature of around 400° C., thereby helping to reduce dopant deactivation effects. However, it is to be understood that the type of material and deposition method chosen for the third spacer 700 are not limited to the above examples and may include any material and deposition method that permits the third spacer 700 to block the subsequent deposition of the electrical contact 800. Moreover, it is to be understood that the third spacer 700 can be formed by a variety of etching techniques, including, for example, anisotropic etching.

In some embodiments, the third spacer 700 may include a thickness ranging from about 200 angstroms to about 700 angstroms at its interface with the substrate 104. However, it is to be understood that the thickness of the third spacer 700 may vary with the design specifications of the active device 102. For example, the thickness of the third spacer 700 may depend upon the desired proximity of the electrical contact 800 to the channel 110.

Figure 8:
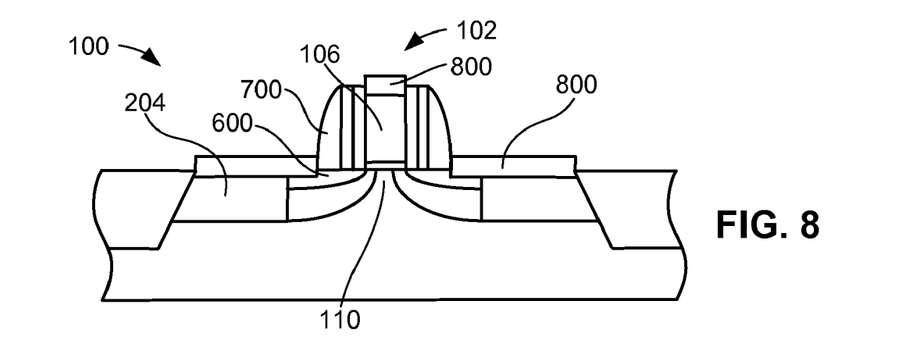
FIG. 8 is the structure of FIG. 7 after forming an electrical contact.

It will be appreciated by those skilled in the art that the electrical contact 800 can affect the mobility of carriers within the channel 110 of the active device 102. For example, in some embodiments, if the electrical contact 800 is placed too close to the channel 110, the electrical contact 800 can detrimentally affect the mobility of carriers within the channel 110. Accordingly, it is to be understood that the thickness of the third spacer can be modulated (e.g., by increasing or decreasing the thickness) to reduce or negate the detrimental effect that the electrical contact 800 can have on carrier mobility within the channel 110.

Referring now to FIG. 8, therein is shown the structure of FIG. 7 after forming the electrical contact 800. Subsequent to forming the third spacer 700, the electrical contact 800, such as a low resistance silicide or salicide electrical contact, can be formed over the gate 106 and adjacent the third spacer 700 (e.g., over a portion of the source/drain 204 and the source/drain extension 600). In some embodiments, the electrical contact 800 may include any conducting compound that forms an electrical interface between itself and another material that is thermally stable and provides uniform electrical properties with low resistance. In other embodiments, the electrical contact 800 may include refractory metal materials such as, tantalum (Ta), cobalt (Co), titanium (Ti), tungsten (W), platinum (Pt), or molybdenum (Mo). In yet other embodiments, the electrical contact 800 formed over a portion of the source/drain 204 and the source/drain extension 600 can be aligned to the third spacer 700 via a salicide process.

It is to be understood that the integrated circuit system 100 may undergo a cleaning step to remove surface contaminants, such as particles, mobile ionic contaminants, organics and native oxides, before formation of the electrical contact 800. Moreover, it will be appreciated by those skilled in the art that the remainder of the integrated circuit system 100 can then be completed by conventional transistor and/or CMOS process steps.

Figure 9:
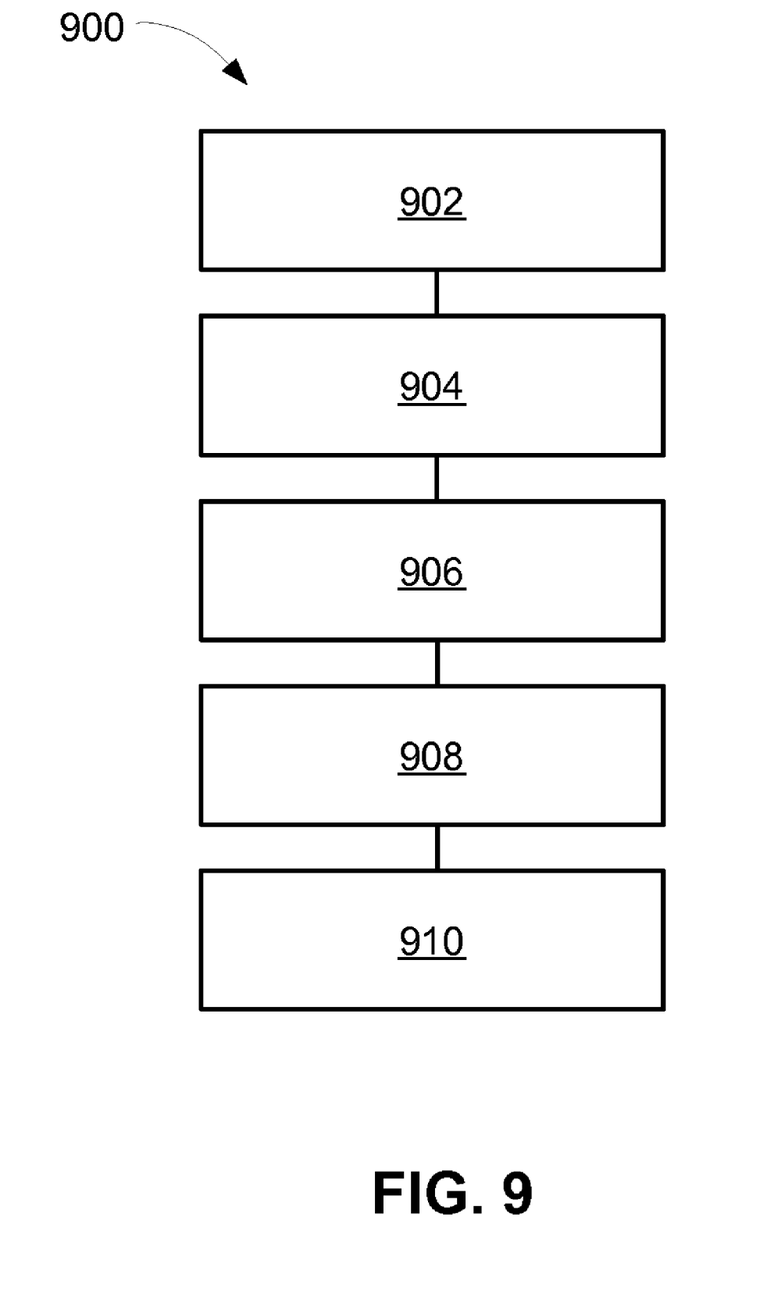
FIG. 9 is a flow chart of an integrated circuit system for an integrated circuit system, in accordance with an embodiment of the present invention.

Referring now to FIG. 9, therein is shown a flow chart of an integrated circuit system 900 for the integrated circuit system 100, in accordance with an embodiment of the present invention. The integrated circuit system 900 includes providing a substrate including an active device with a gate and a gate dielectric in a block 902; forming a first liner, a first spacer, a second liner, and a second spacer adjacent the gate in a block 904; forming a material layer over the integrated circuit system in a block 906; forming an opening between the material layer and the first spacer by removing a portion of the material layer, the second spacer, and the second liner to expose the substrate in a block 908; and forming a source/drain extension and a halo region through the opening in a block 910.

It has been discovered that the present invention thus has numerous aspects. One such aspect is that the present invention minimizes junction capacitance and junction leakage by forming a halo region with the tail of the halo implant located within a source/drain. By not forming the tail of the halo implant outside of the source/drain, junction capacitance and junction leakage can be reduced.

Another aspect is that the present invention can suppress short channel effects by forming a highly-doped and abrupt source/drain extension and a highly confined/abrupt halo region. By forming a highly-doped and abrupt source/drain extension and a highly confined/abrupt halo region, the present embodiments help to suppress short channel effects, thereby improving drive current, threshold voltage roll-off, and drain-induced barrier lowering within an active device.

Another aspect is that the present invention can suppress short channel effects by reducing the need for a graded source/drain. By reducing the need for a graded source/drain, the present embodiments help to suppress short channel effects, thereby improving drive current, threshold voltage roll-off, and drain-induced barrier lowering within an active device.

Another aspect is that the present invention can accurately control the placement of a source/drain extension and a halo region by strategically altering the thickness of each of a first liner, a first spacer, a second liner, and/or a second spacer.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit system of the present invention furnishes important and heretofore unknown and unavailable solutions, capabilities, and functional aspects for forming an integrated circuit system including structures strategically designed to suppress short channel effects. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacture of an integrated circuit system comprising:
   providing a substrate including an active device with a gate and a gate dielectric;
   forming a first liner, a first spacer, a second liner, and a second spacer adjacent the gate;
   forming a material layer over the integrated circuit system;
   forming an opening between the material layer and the first spacer by removing a portion of the material layer, the second spacer, and the second liner to expose the substrate; and
   forming a source/drain extension and a halo region through the opening, the halo region formed partially outside the source/drain extension.

2. The method as claimed in claim 1 wherein:
   providing the substrate including the active device includes providing an NFET device, a PFET device, or a CMOS device.

3. The method as claimed in claim 1 wherein:
   forming the first liner and the second liner includes forming an oxide and forming the first spacer and the second spacer includes forming a nitride.

4. The method as claimed in claim 1 wherein:
   forming the material layer includes forming a nonconformal oxide.

5. The method as claimed in claim 1 further comprising:
configuring the thickness of each of the first liner, the first spacer, the second liner, and the second spacer to determine the location of the source/drain extension and the halo region.

6. A method of manufacture of an integrated circuit system comprising:
providing a substrate including an active device with a gate and a gate dielectric;
forming a first liner, a first spacer, a second liner, and a second spacer adjacent the gate;
forming a material layer over the integrated circuit system;
etching the material layer to expose the second spacer;
removing the second spacer and the second liner; and
forming a source/drain extension and a halo region through an opening formed by the removal of the second spacer and the second liner, the halo region formed partially outside the source/drain extension.

7. The method as claimed in claim 6 wherein:
etching the material layer to expose the second spacer includes leaving portions of the material layer remaining over the source/drain and the gate.

8. The method as claimed in claim 6 wherein:
removing the second spacer and the second liner exposes a portion of the substrate.

9. The method as claimed in claim 6 wherein:
forming the source/drain extension and the halo region includes an angled implant.

10. The method as claimed in claim 6 further comprising:
forming a source/drain before forming the source/drain extension and the halo region.

11. A method of manufacture of an integrated circuit system comprising:
providing a substrate including an active device with a gate and a gate dielectric;
forming a first liner, a first spacer, a second liner, and a second spacer adjacent the gate;
forming a material layer over the integrated circuit system;
etching the material layer to expose the second spacer;
removing the second spacer and the second liner;
forming a source/drain extension and a halo region through an opening formed by the removal of the second spacer and the second liner, the halo region formed partially outside the source/drain extension;
forming a third spacer adjacent the first spacer; and
forming an electrical contact adjacent the third spacer and over the gate.

12. The method as claimed in claim 11 wherein:
providing the substrate including the active device includes providing an NFET device, a PFET device, or a CMOS device.

13. The method as claimed in claim 11 wherein:
forming the first liner and the second liner includes forming an oxide and forming the first spacer and the second spacer includes forming a nitride.

14. The method as claimed in claim 11 wherein:
forming the material layer includes forming a nonconformal oxide.

15. The method as claimed in claim 11 wherein:
etching the material layer to expose the second spacer includes leaving portions of the material layer remaining over the source/drain and the gate.

16. The method as claimed in claim 11 wherein:
removing the second spacer and the second liner exposes a portion of the substrate.

17. The method as claimed in claim 11 wherein:
forming the source/drain extension and the halo region includes an angled implant.

18. The method as claimed in claim 11 wherein:
forming the third spacer alters the proximity affect of the electrical contact upon a channel.

19. The method as claimed in claim 11 further comprising:
configuring the thickness of each of the first liner, the first spacer, the second liner, and the second spacer to determine the location of the source/drain extension and the halo region.

20. The method as claimed in claim 11 further comprising:
forming a source/drain before forming the source/drain extension and the halo region.

* * * * *